(12) United States Patent
Shishino

(10) Patent No.: US 11,371,119 B2
(45) Date of Patent: Jun. 28, 2022

(54) PRECIPITATION-HARDENING AG—PD—CU—IN—B ALLOY

(71) Applicant: TOKURIKI HONTEN CO., LTD., Tokyo (JP)

(72) Inventor: Ryu Shishino, Tokyo (JP)

(73) Assignee: TOKURIKI HONTEN CO., LTD., Tokyo (JP)

( * ) Notice: Subject to any disclaimer, the term of this patent is extended or adjusted under 35 U.S.C. 154(b) by 72 days.

(21) Appl. No.: 16/958,573

(22) PCT Filed: Dec. 27, 2017

(86) PCT No.: PCT/JP2017/047072
§ 371 (c)(1),
(2) Date: Jun. 26, 2020

(87) PCT Pub. No.: WO2019/130511
PCT Pub. Date: Jul. 4, 2019

(65) Prior Publication Data
US 2021/0017627 A1    Jan. 21, 2021

(51) Int. Cl.
*C22C 5/04* (2006.01)
*C22C 30/02* (2006.01)
*G01R 1/067* (2006.01)

(52) U.S. Cl.
CPC ............... *C22C 5/04* (2013.01); *C22C 30/02* (2013.01); *G01R 1/06755* (2013.01)

(58) Field of Classification Search
CPC .................................. C22C 30/02; C22C 5/04
See application file for complete search history.

(56) References Cited

U.S. PATENT DOCUMENTS

2014/0377129 A1\* 12/2014 Shishino ................. C22C 30/02
420/587

FOREIGN PATENT DOCUMENTS

| JP | 50-160797 | 12/1975 |
| JP | 10-221366 A | 8/1998 |
| JP | 2011-122194 A | 6/2011 |
| JP | 2011122194 | 6/2011 |
| JP | 2014-523527 A | 9/2014 |

OTHER PUBLICATIONS

Mitsunori Sato, "Electric contact—materials and characteristics—" The Nikkan Kogyo Shimbun, Jun. 30, 1984, First printing, First edition, p. 74.
Chinese Patent Appln. No. 201780097805.4—First Office Action dated Apr. 6, 2021.

\* cited by examiner

*Primary Examiner* — Jessee R Roe
(74) *Attorney, Agent, or Firm* — Kane Kessler, P.C.; Barry E. Negrin

(57) ABSTRACT

A precipitation-hardening alloy, including 17 to 23.6 at % of Ag, 0.5 to 1.1 at % of B, and a total of 74.9 to 81.5 at % of Pd and Cu, wherein the at % ratio of the Pd and Cu is 1:1 to 1:1.2, and the rest includes In and inevitable impurities. This provides an alloy with good overall balance, having all of maintaining low specific resistance, at least almost equal to that of conventional Ag—Pd—Cu alloys, and also having contact resistance stability (oxidation resistance), good plastic workability, and higher hardness than before.

12 Claims, 4 Drawing Sheets

[Fig. 1]
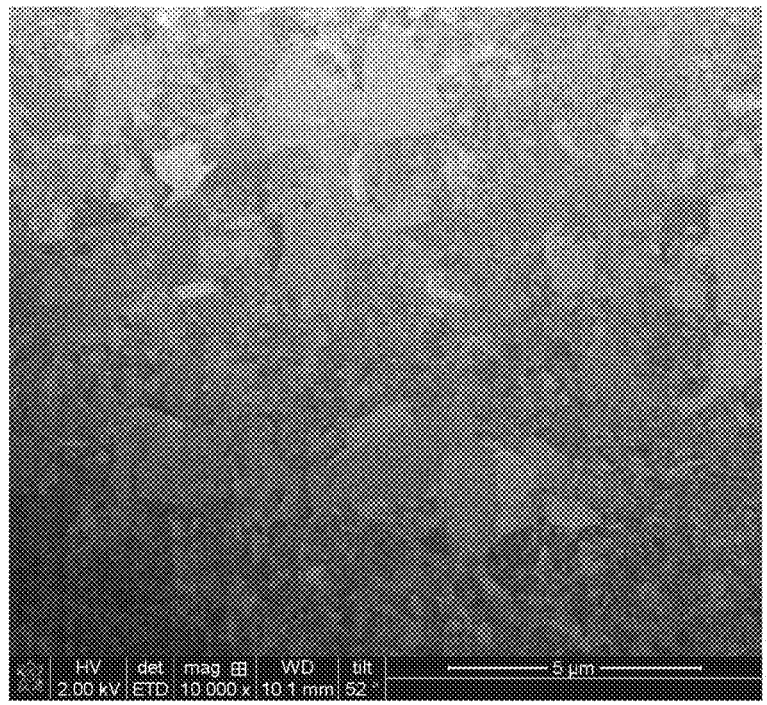
[Fig. 2]
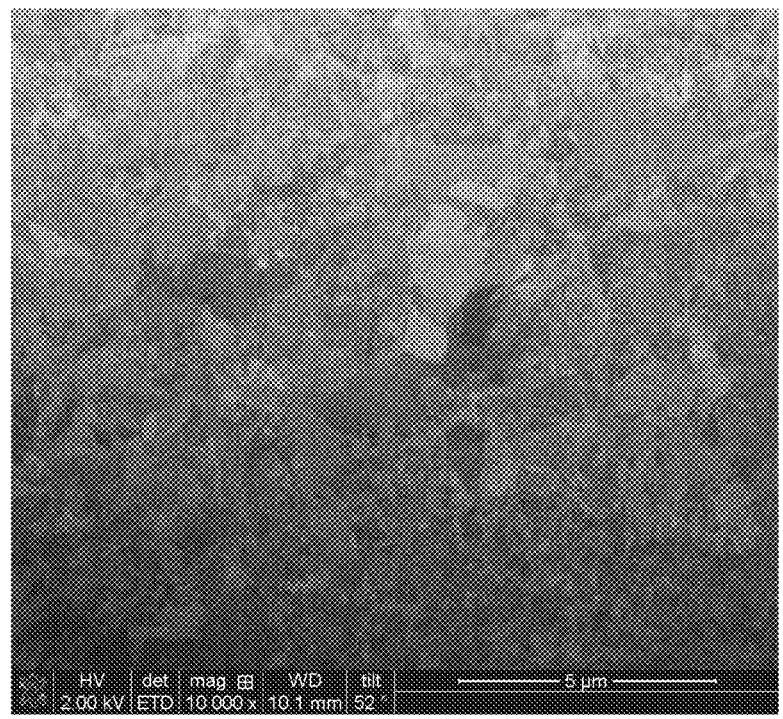

[Fig. 3]
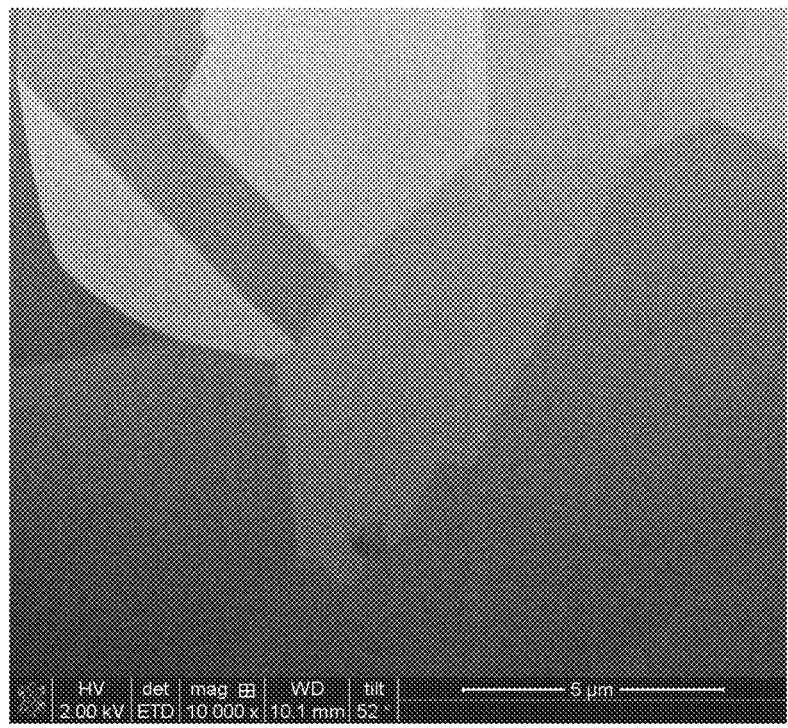
[Fig. 4]
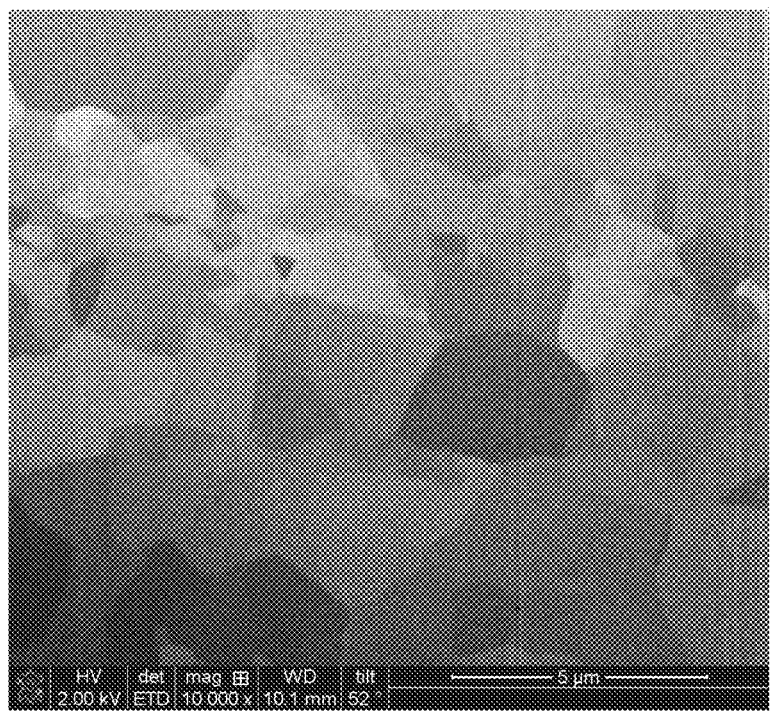

[Fig. 5]
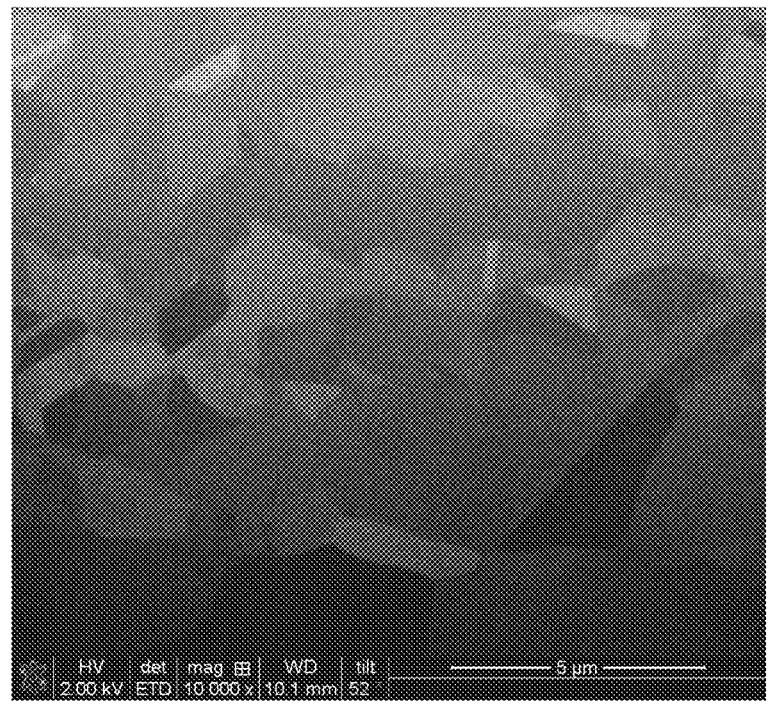
[Fig. 6]
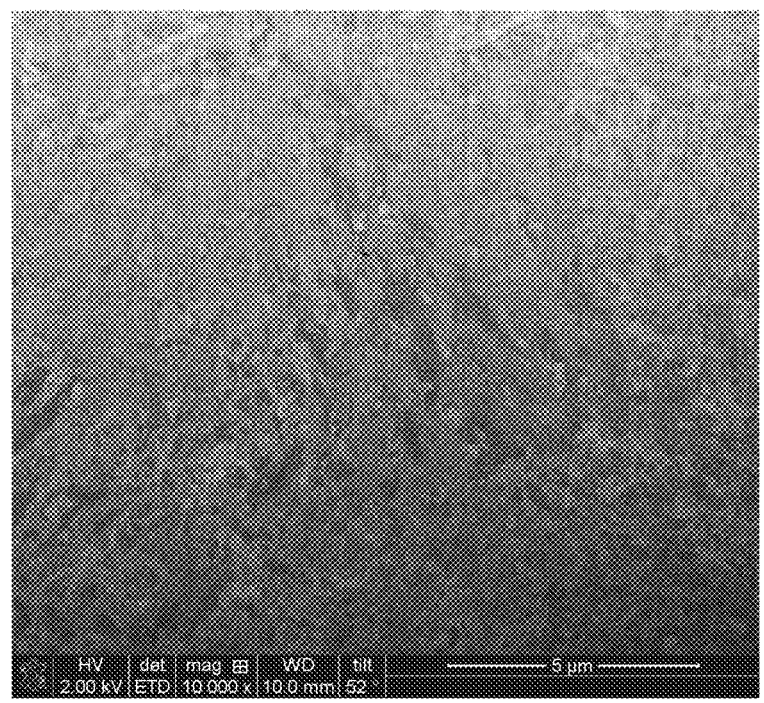

[Fig. 7]
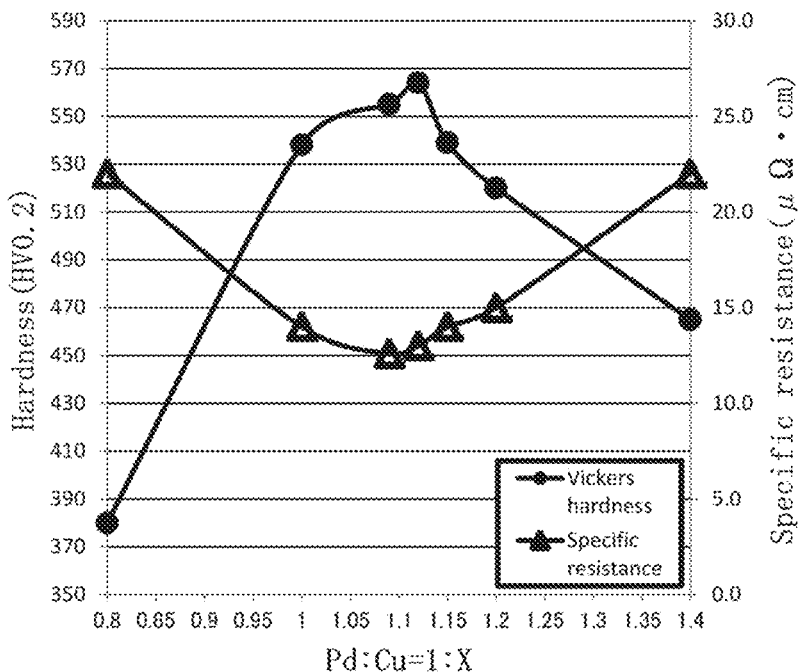
[Fig. 8]
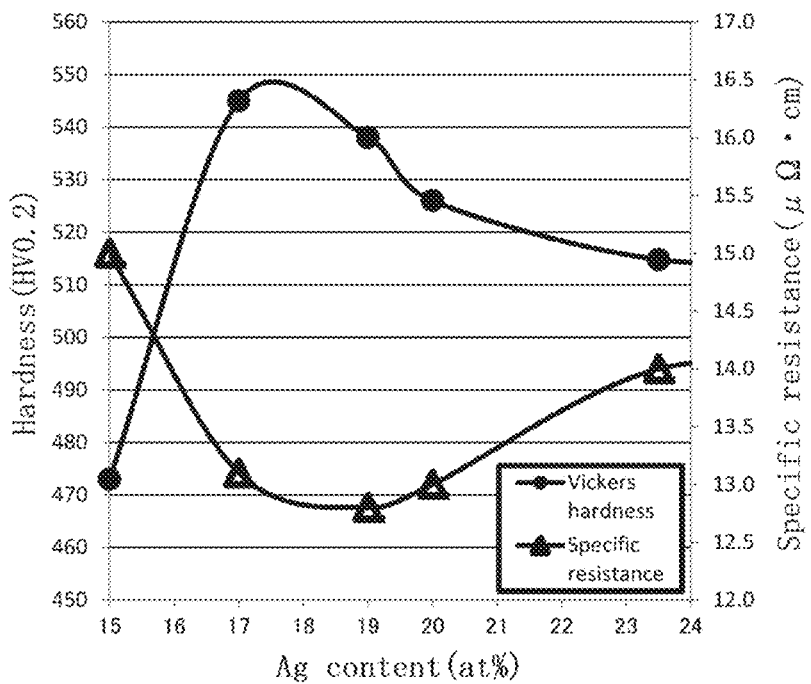

PRECIPITATION-HARDENING AG—PD—CU—IN—B ALLOY

TECHNICAL FIELD

The present invention relates to an alloy, applied to parts and members for electric and electronic equipment application, such as a connector, a terminal, an electric contact and a contact probe.

BACKGROUND ART

An IC test socket is formed from a number of contact probe pins arranged on a substrate. The IC test socket takes a role in connecting electrodes on a semiconductor element such as IC (integrated circuit), an object to be tested, and test equipment (tester), and is used for an electrical inspection thereof by bringing the contact probe pins into contact with e.g. electrodes or Sn solder on the semiconductor element.

An electrical inspection of IC (integrated circuit) can be carried out under room temperature environment, or can be carried out under high temperature environment (e.g. 120 to 160° C.) supposed as usage environment depending on IC (integrated circuit) application.

As materials for such contact probe pins, a Re—W alloy (e.g. Patent Document 1), a Be—Cu alloy plated with e.g. Au (e.g. Patent Document 2), and a precipitation-hardening Ag—Pd—Co alloy (e.g. Patent Document 3) have been used.

Materials for contact probe pins used for IC test sockets are demanded to have a good electrical resistance value (low specific resistance) and a stable contact resistance value even after a long period of use (oxidation resistance), and not to easily cause abrasion by repeated contacts with a test object over a few hundred to a few tens of thousands of times (high hardness).

Contact probe pins having the above-mentioned alloys as a material, however, do not sufficiently meet all requirements demanded as a material for contact probe pins in an electrical inspection under high temperature environment.

Contact probe pins using W such as a Re—W alloy, specifically, have low specific resistance, sufficiently high hardness, and good abrasion resistance. However, oxidation resistance is poor under high temperature environment, and therefore an insulating oxide coating is produced on the surface thereof. Furthermore, the oxide drops off and attaches to a test object, and defective conduction can be caused, and a stable contact resistance value is not obtained.

Contact probe pins using a Be—Cu alloy plated with e.g. Au are good in terms of low specific resistance. However, plating to prevent the oxidation of the Be—Cu alloy is peeled off by repeated contacts with a test object; accordingly, abrasion resistance is poor. Furthermore, due to repeated contacts with a test object under high temperature environment, for example, an Au—Sn alloy derived from e.g. an Sn component included in an Sn plated electrode or Sn solder, a test object, and Au, a plating component for a contact terminal, easily corrodes the surface of the contact terminal; accordingly, contact resistance stability is poor.

Contact probe pins using an Ag—Pd—Cu alloy include a large amount of noble metal and Cu with good electrical conductivity and thus low specific resistance is obtained. Furthermore, noble metal has also the properties of being resistant to oxidizing; accordingly, plating treatment for antioxidation is not required and oxidation resistance is good. For abrasion resistance, it is harder than the Be—Cu alloy and is the hardest material next to the Re—W alloy; accordingly, it is not the most appropriate but does not have a practical problem.

From such overall viewpoint, Ag—Pd—Cu alloys have been heavily used as a material for conventional contact probe pins. In recent years, however, it is required that the tip shape of contact probe pins be thinner and sharper for the densification of IC (integrated circuit), and the contact probe pins tends to be easily broken and worn. Therefore, materials for contact probe pins are naturally demanded to have low specific resistance and contact resistance stability (oxidation resistance) at least almost equal to those of previous ones, and are required to have further mechanical strength and abrasion resistance (high hardness).

PRIOR ART DOCUMENTS

Patent Document

Patent Document Japanese Unexamined Patent Application Publication No. 10-221366
Patent Document 2: Japanese Translation of PCT International Application Publication No. JP-T-2014-523527
Patent Document 3: Japanese Unexamined Patent Application Publication No. 50-160797
Patent Document 4: Japanese Unexamined Patent Application Publication No. 2011-122194

Non-Patent Document

Non-patent Document 1 Mitsunori Sato, "Electric contact—materials and characteristics—" THE NIKKAN KOGYO SHIMBUN, Jun. 30, 1984, First printing, First edition, p 74

SUMMARY OF THE INVENTION

Problems to be Solved by the Invention

Conventional ternary Ag—Pd—Cu alloys, however, show highest hardness in this system (450 HV) in the case of 30 mass % Ag-40 mass % Pd-30 mass % Cu (24.7 at % Ag-33.4 at % Pd-41.9 at % Cu), and this is because all intermetallic compounds such as PdCu and $PdCu_3$ are thought to be precipitated in this composition, and there is a problem in that higher hardness than the above cannot be obtained (e g Non-patent Document 1).

In addition, various materials to be provided high hardness by adding various additional elements to 30 mass % Ag-40 mass % Pd-30 mass % Cu for solution hardening, have been developed (e.g. Patent Document 4); however, as additional elements are added to increase a multinary system and as the amount of additional element added increases, specific resistance tends to inevitably increase, and there is a problem in that both higher hardness and low specific resistance cannot be substantially obtained.

In addition, it is well known that as high deformation (plastic working) is provided, the hardness of alloys is improved; however, as solution hardening is carried out by adding the above-described additional elements, plastic workability is reduced. Therefore, there is a problem in that higher hardness than the above cannot be substantially obtained.

Furthermore, in contact probe pins using the above various materials it is required to frequently clean and exchange contact terminals, which has a problem in that the reliability and operating rate a test process are significantly reduced.

From such circumstances, the development of materials for contact probe pins with good overall balance, having all of low specific resistance, plastic workability and contact resistance stability (oxidation resistance) at least almost equal to those of previous ones, and higher hardness than before, has been demanded in the market.

A subject of the present invention is to solve such problems.

Means for Solving the Problems

Therefore, as a result of diligent investigation to achieve such object, the present inventors provided a precipitation-hardening Ag—Pd—Cu—In—B alloy having the following specific composition range.

A first invention of the present application s characterized by a precipitation-hardening alloy, including 17 to 23.6 at % of Ag, 0.5 to 1.1 at % of B, and a total of 74.9 to 81.5 at % of Pd and Cu, wherein the at % ratio of the Pd and Cu is 1:1 to 1:1.2, and the rest includes In and inevitable impurities.

In addition, a second invention is characterized in that Vickers hardness is 515 HV or more in the above first invention.

In addition, a third invention is characterized in that specific resistance is 15 μΩ·cm or less in the above second invention.

In addition, a fourth invention is characterized by having a largest grain size of crystal grains of 1.0 μm or less and a metallographic structure having uniformly distributed intermetallic compounds in the above third invention.

In addition, a fifth invention is characterized in that an alloy according to any one of the above first to fourth inventions is applied to electric and electronic equipment.

In addition, a sixth invention is characterized in that an alloy according to any one of the above first to fourth inventions is applied to contact probe pins.

The precipitation-hardening Ag—Pd—Cu—In—B alloy of the present invention includes 17 to 23.6 at % of Ag, and a total of 74.9 to 81.5 at % of Pd and Cu, wherein the at % ratio of the Pd and Cu is 1:1 to 1:1.2, and the B content is 0.5 to 1.1 at %. This is because a metallographic structure having homogeneously precipitated intermetallic compounds can be obtained, oxidation resistance is good, and low specific resistance is obtained. In addition, when the B content is less than 0.5 at %, sufficient hardness is not obtained, and when the B content is above 1.1 at %, plastic workability is reduced and moreover the precipitation of intermetallic compounds is inhibited.

The in content in the rest is preferably 0.5 at % or more, more preferably 0.5 to 1.5 at %, and most preferably 0.75 to 0.8 at %. This is because, when the content is less than 0.5 at %, a sufficient effect to improve hardness is not obtained, and when the content is above 1.5 at %, even though the range of improvement in hardness is small with respect to the amount of In added, plastic workability is reduced and specific resistance tends to increase.

It should be noted that the present invention may include at least one or more selected from the group of Ir, Rh, Co, Ni, Zn, Sn, Au and Pt as additional elements for the precipitation-hardening Ag—Pd—Cu—In—B alloy in an amount of 0.1 to 2.0 at % in total.

The inevitable impurities in the present invention are defined as 100 ppm or less of impurities which cannot be avoided in mass-production.

In addition, the precipitation-hardening type indicates an alloy including a precipitation hardening element, and means an alloy having a function for which, when a precipitation hardening element is dissolved in the parent phase to supersaturation by heating to solution treatment temperature, and then maintained at a temperature lower than the solid solubility curve for a certain period of time, fine grains of intermetallic compounds, precipitates, are precipitated from crystals of a saturated solid solution, thereby carrying out precipitation hardening. A concept thereof is fixed as a term to specify the structure or characteristics of an object.

Advantageous Effect of the Invention

In the present invention described above, the above first invention has the effect of obtaining plastic workability and contact resistance stability (oxidation resistance) at least almost equal to those of previous alloys.

In addition, the above second invention has the effect of obtaining mechanical strength and abrasion resistance (high hardness) higher than before in addition to the above effect of the first invention.

In addition, the above third invention has the effect of obtaining low specific resistance at least almost equal to that of previous alloys in addition to the above effect of the second invention.

In addition, the above fourth invention has the effect of obtaining an alloy with high reliability in addition to the above effect of the third invention because, when crystal grains have a largest grain size of 1.0 μm or less and there is a metallographic structure having uniformly distributed intermetallic compounds, such minute homogeneous metallographic structure expresses more stable mechanical strength and abrasion resistance.

In addition, the above fifth invention is electric and electronic equipment using an alloy according to any one of the above first to fourth inventions, and thus has low specific resistance, plastic workability and contact resistance stability (oxidation resistance) at least almost equal to those of previous alloys and moreover has higher mechanical strength and abrasion resistance (high hardness) than before; accordingly electric and electronic equipment can be cheaply and simply produced.

In addition, the above sixth invention can provide a material for contact probe pins with good overall balance, having all of low specific resistance, plastic workability and contact resistance stability (oxidation resistance) at least almost equal to those of previous alloys and moreover higher hardness than before; accordingly reliability and an operating rate can be improved in a test process for e.g. IC (integrated circuit).

BRIEF DESCRIPTION OF THE DRAWINGS

FIG. 1 is an SEM image of the cross-sectional structure of a solution-treated material in Example (No. 4).

FIG. 2 is an SEM image of the cross-sectional structure of a solution-treated material in Comparative Example (No. 20).

FIG. 3 is an SEM image of the cross-sectional structure of a solution-treated material in Comparative Example (No. 21).

FIG. 4 is an SEM image of the cross-sectional structure of a precipitation-hardened material in Example (No. 4).

FIG. 5 is an SEM image of the cross-sectional structure of a precipitation-hardened material in Comparative Example (No. 20).

FIG. 6 is an SEM image of the cross-sectional structure of a precipitation-hardened material in Comparative Example (No. 21).

FIG. 7 is an explanatory drawing showing a relationship between Vickers hardness and specific resistance of the cross-section of precipitation-hardened materials according to the present invention.

FIG. 8 is an explanatory drawing showing a relationship between Vickers hardness and specific resistance of the cross-section of precipitation-hardened materials according to the present invention.

MODE FOR CARRYING OUT THE INVENTION

Examples and Comparative Examples of precipitation-hardening Ag—Pd—Cu—In—B alloys in the present invention will now be described with reference to the drawings.

EXAMPLES

Ag, Pd, Cu, In and B were blended so that various target compositions were obtained, followed by high frequency melting to produce an ingot (Φ15 mm×L 100 mm). The composition in each of Examples and Comparative Examples (CE for short) is shown in Table 1. It should be noted that Comparative Examples 19 and 20 show the compositions of conventional Ag—Pd—Cu alloys, and Comparative Example 21 shows the composition of a conventional Ag—Pd—Cu—In alloy.

In and inevitable impurities, the rest in the component composition, were shown as Balance (Bal.) by quantitative analysis of various compositions.

It should be noted that the method for producing an ingot according to the present invention is not limited to high frequency melting, and any melting method developed presently and in the future such as gas melting, an electric furnace, vacuum melting, continuous casting or one melting can be applied to the present invention.

Subsequently, melting defects such as shrinkage of the above ingot were removed, and plastic working was then carried out by wire drawing until a predetermined size (Φ1.0 mm). After that, heating was carried out in a reducing atmosphere (a mixed atmosphere of $H_2$ and $N_2$) at 800° C. for 60 min, and water cooling was carried out to ambient temperature for solution treatment to obtain a solution-treated material.

It should be noted that the plastic working method of the present invention is not limited to wire drawing, and various plastic working methods can be applied alone or in combination depending on desired characteristics and shapes. Examples thereof include rolling, groove rolling and swaging and the like.

The observation results of the cross-sectional structure of the above solution-treated material by SEM (Scanning Electron Microscope) are shown in FIGS. 1 to 3.

Subsequently, the above solution-treated material was subjected to wire drawing to evaluate plastic workability.

It should be noted that the plastic working method for a solution-treated material according to the present invention is not limited to wire drawing, and various plastic working methods can be applied alone or in combination depending on desired characteristics and shapes. Examples thereof include rolling, groove rolling and swaging and the like.

The evaluation of plastic workability of a solution-treated material is defined as:

Reduction in area (%)=[(cross-sectional area before plastic working−cross-sectional area after plastic working)/cross-sectional area before plastic working]×100, and was made by examining a reduction in area until e.g. cracks or ruptures are caused at the time of wire drawing.

Specifically, samples with a reduction in area of less than 50% as plastic working, those with a reduction in area of 50% or more and less than 75%, and those with a reduction in area of 75% without e.g. cracks or ruptures were evaluated as C, B and A, respectively. Plastic workability in each of Examples and Comparative Examples (CE for short) is shown in Table 2. It should be noted that Examples and Comparative Examples are distinguished by numbers, and shown in Table 2 in a form corresponding to Table 1.

TABLE 1

| | No. | Compositions (at %) | | | | In and Inevitable impurities | Total of Pd and Cu (at %) | At % ratio of Pd and Cu |
| | | Ag | Pd | Cu | B | | | |
| --- | --- | --- | --- | --- | --- | --- | --- | --- |
| Examples | 1 | 19.00 | 44.10 | 35.30 | 0.80 | Bal. | 79.40 | 1:0.8 |
| | 2 | 19.00 | 37.99 | 41.41 | 0.80 | Bal. | 79.40 | 1:1.09 |
| | 3 | 19.00 | 39.70 | 39.70 | 0.80 | Bal. | 79.40 | 1:1 |
| | 4 | 19.00 | 37.40 | 42.00 | 0.80 | Bal. | 79.40 | 1:1.12 |
| | 5 | 19.00 | 36.93 | 42.47 | 0.80 | Bal. | 79.40 | 1:1.15 |
| | 6 | 19.00 | 36.10 | 43.30 | 0.80 | Bal. | 79.40 | 1:1.20 |
| | 7 | 19.00 | 33.10 | 46.30 | 0.80 | Bal. | 79.40 | 1:1.40 |
| | 8 | 17.00 | 40.73 | 40.73 | 0.75 | Bal. | 81.46 | 1:1 |
| | 9 | 20.00 | 39.23 | 39.23 | 0.75 | Bal. | 78.46 | 1:1 |
| | 10 | 23.58 | 37.45 | 37.45 | 0.75 | Bal. | 74.90 | 1:1 |
| | 11 | 15.00 | 41.73 | 41.73 | 0.75 | Bal. | 83.46 | 1:1 |
| | 12 | 22.64 | 32.20 | 40.45 | 3.96 | Bal. | 72.65 | 1:1.26 |
| | 13 | 23.13 | 32.67 | 41.03 | 2.41 | Bal. | 73.70 | 1:1.26 |
| | 14 | 23.38 | 32.91 | 41.33 | 1.62 | Bal. | 74.24 | 1:1.26 |
| | 15 | 23.50 | 33.03 | 41.48 | 1.22 | Bal. | 74.51 | 1:1.26 |
| | 16 | 20.50 | 38.75 | 38.75 | 0.50 | Bal. | 77.50 | 1:1 |
| | 17 | 17.40 | 40.50 | 40.50 | 1.10 | Bal. | 81.00 | 1:1 |
| | 18 | 17.00 | 40.50 | 40.50 | 1.50 | Bal. | 81.00 | 1:1 |
| CE | 19 | 20.00 | 40.00 | 40.00 | — | — | 80.00 | 1:1 |
| | 20 | 24.70 | 33.40 | 41.90 | — | — | 75.30 | 1:1.25 |
| | 21 | 23.90 | 33.40 | 41.90 | — | Bal. | 75.30 | 1:1.25 |

TABLE 2

|  | No. | Vickers hardness (HV) | Specific resistance (μΩ · cm) | Plastic workability | Comprehensive evaluation |
|---|---|---|---|---|---|
| Examples | 1 | 379 | 22.0 | A | F |
|  | 2 | 555 | 12.6 | A | P |
|  | 3 | 538 | 12.8 | A | P |
|  | 4 | 564 | 13.0 | A | P |
|  | 5 | 539 | 14.0 | A | P |
|  | 6 | 520 | 15.0 | A | P |
|  | 7 | 464 | 22.0 | A | F |
|  | 8 | 545 | 13.1 | A | P |
|  | 9 | 527 | 13.0 | A | P |
|  | 10 | 515 | 14.0 | A | P |
|  | 11 | 474 | 15.0 | A | F |
|  | 12 | 475 | 22.0 | C | F |
|  | 13 | 470 | 20.0 | C | F |
|  | 14 | 480 | 17.0 | B | F |
|  | 15 | 485 | 15.0 | B | F |
|  | 16 | 545 | 14.6 | A | P |
|  | 17 | 520 | 15.0 | A | P |
|  | 18 | 448 | 27.0 | B | F |
| CE | 19 | 393 | 16.0 | A | F |
|  | 20 | 455 | 13.0 | A | F |
|  | 21 | 484 | 16.0 | A | F |

From Table 2, the evaluation of A, equivalent to plastic workability of the Ag—Pd—Cu alloys and Ag—Pd—Cu—In alloy, conventional alloys, is obtained in the specific composition region of the present invention.

It should be noted that in order to compare and evaluate the present invention and Comparative Examples under the same conditions, the reduction in area is 75%, which can be suitably used for contact probe pin application, in Table 2; however, the reduction in area can be increased or reduced from 0 to 99.5% depending on desired characteristics such as hardness in the present invention.

Subsequently, a solution-treated material was completely subjected to precipitation hardening to precipitate inter metallic compounds, precipitates, by heating at 360° C. for 60 min in a reducing atmosphere (a mixed atmosphere of $H_2$ and $N_2$) after wire drawing. The obtained precipitation-hardened material can be suitably used for electric and electronic equipment application or contact probe pin application.

It should be noted that the implementation and degree of precipitation hardening for the precipitation-hardening alloy of the present invention can be properly adjusted depending on desired characteristics.

The observation results of the cross-sectional structure of the above precipitation-hardened material by SEM (Scanning Electron Microscope) are shown in FIGS. 4 to 6. In addition, the Vickers hardness (test load 0.2 kg) and specific resistance of precipitation-hardened materials in Examples and Comparative Examples are also shown in Table 2. The specific resistance of precipitation-hardened materials was calculated from the actual size of the precipitation-hardened materials by measuring a resistance value by the four-terminal method using a digital multi-meter.

From Table 2, it could be verified that both low specific resistance, 15 μΩ·cm or less, which is not a practical problem, and high hardness, a Vickers hardness of 515 HV or more, could be obtained in the specific composition region of the present invention compared to those of Ag—Pd—Cu alloys and Ag—Pd—Cu—In alloy, conventional alloys.

The oxidation resistance of the above precipitation-hardened materials was evaluated. As the method for evaluating oxidation resistance, a precipitation-hardened material was retained in a high temperature atmosphere, 150° C., using a thermostat for 24 hours, the surface of the precipitation-hardened material was observed with naked eyes and using an electronic microscope after testing, and changes in color (change in quality of oxides and other substances) were examined. Furthermore, changes in specific resistance of the precipitation-hardened material were examined before and after the testing.

As a result, it could be verified that changes in color were not caused, specific resistance was not changed, and good oxidation resistance was obtained under high temperature environment in all of the Examples and Comparative Examples of the present invention.

Furthermore, when the cross-sectional structures of the solution-treated materials in FIGS. 1 to 3 and the precipitation-hardened material s in FIGS. 4 to 6 were compared, coarse crystal grains caused at the time of solution treatment remained even after precipitation hardening and a hetero-geneous metallographic structure is obtained in conventional ternary precipitation-hardening Ag—Pd—Cu alloys and quaternary precipitation-hardening Ag—Pd—Cu—In alloy (FIG. 2 and FIG. 5, and FIG. 3 and FIG. 6).

When coarse crystal grains remaining in these precipitation-hardened materials of the alloys were examined, crystal grains with a largest grain size of 5 μm remained. It should be noted that the largest crystal grain size was found by observing cross-sectional structures at optional 5 sites of a precipitation-hardened material by SEM (Scanning Electron Microscope) with a magnification of 10000 times and measuring the long diameter of crystals existing in each observation area.

In the quinary precipitation-hardening Ag—Pd—Cu—In—B alloy of the present invention, meanwhile, coarse crystal grains not including an intermetallic compound do not exist in the metallographic structure thereof, and the metallographic structure having homogeneously precipitated intermetallic compounds throughout the alloy could be verified (FIG. 1 and FIG. 4).

Furthermore, when crystal grains remaining in a precipitation-hardened material in the specific composition region of the invention of the present application were examined in the same manner as above, it could be verified that the largest grain size was 1.0 μm and an extremely minute homogeneous metallographic structure having uniformly distributed intermetallic compounds was obtained.

Such phenomenon is a phenomenon verified for the first time in the specific composition region of the present invention.

For this unique phenomenon it is thought, that because the generation of intermetallic compounds is promoted in the specific composition region of the present invention compared to that or conventional alloys, a homogeneous minute metallographic structure is obtained and both higher hardness and low specific resistance can be maintained by such metallographic structure.

It is thought that precipitates in the present invention include at least one or more intermetallic compounds having at least two elements selected from the group of Ag, Pd, Cu, in and B.

FIG. 7 shows a relationship between Vickers hardness and specific resistance of the cross-section of precipitation-hardened materials in Examples (No. 1 to No. 7) in Table 2.

From FIG. 7, it could be verified that both high hardness, 515 HV or more, and low specific resistance, 15 μΩ·cm or less, could be obtained only in the specific composition region of the present invention.

FIG. 8 shows a relationship between Vickers hardness and specific resistance of the cross-section of precipitation-hardened materials when the at % ratio of Pd and Cu is fixed to 1:1 and moreover the Ag content is changed in Examples (No. 3, No. 8 to No. 11) in Table 2.

When Examples (in FIG. 8) and Comparative Examples (No. 20-21) were compared, it could be verified that both higher hardness, 515 HV or more, and low specific resistance, 15 µΩ·cm or less, could be obtained in the specific composition region of the present invention even when the Ag content was changed.

Here, the comprehensive evaluation of each Example is carried out. As the evaluation method, only particularly good cases of Examples, meeting all of the 4 conditions of a specific resistance of 15 µΩ·cm or less, plastic workability with a reduction in area of 75% or more, a Vickers hardness of 515 HV or more, and contact resistance stability (oxidation resistance) under high temperature environment, are evaluated as pass and shown by P in Table 2, and the other cases are evaluated as fail and shown by F in Table 2.

From the above results it could be verified that a material for contact probe pins with good overall balance, having al of low specific resistance (15 µΩ·cm or less), plastic workability (a reduction in area of 75% or more), and contact resistance stability (oxidation resistance) at least almost equal to those of previous alloys, and higher hardness (515 HV or more) than before in the specific composition region of the present invention, could be provided. It, could be also verified that a material for electric and electronic equipment (e.g. a connector, a terminal, an electrical contact) having these characteristics could be provided.

It should be noted that the embodiment of the present invention is not limited to the above embodiment, and can be properly adjusted depending on target shapes, sizes and characteristics.

The invention claimed is:

1. A quinary precipitation-hardening Ag—Pd—Cu—In—B alloy, consisting essentially of 17 to 23.6 at % of Ag, 0.5 to 1.1 at % of B, and a total of 74.9 to 81.5 at % of Pd and Cu, wherein an at % ratio of the Pd and Cu is 1:1 to 1:1.2, and a rest comprises In and inevitable impurities.

2. The quinary precipitation-hardening Ag—Pd—Cu—In—B alloy according to claim 1, characterized by being applied to electric and electronic equipment.

3. The quinary precipitation-hardening Ag—Pd—Cu—In—B alloy according to claim 1, characterized by being applied to contact probe pins.

4. The quinary precipitation-hardening Ag—Pd—Cu—In—B alloy according to claim 1, characterized in that Vickers hardness is 515 HV or more.

5. The quinary precipitation-hardening Ag—Pd—Cu—In—B alloy according to claim 4, characterized by being applied to electric and electronic equipment.

6. The quinary precipitation-hardening Ag—Pd—Cu—In—B alloy according to claim 4, characterized by being applied to contact probe pins.

7. The quinary precipitation-hardening Ag—Pd—Cu—In—B alloy according to claim 4, characterized in that specific resistance is 15 µΩ cm or less.

8. The quinary precipitation-hardening Ag—Pd—Cu—In—B alloy according to claim 7, characterized by being applied to electric and electronic equipment.

9. The quinary precipitation-hardening Ag—Pd—Cu—In—B alloy according to claim 7, characterized by being applied to contact probe pins.

10. The quinary precipitation-hardening Ag—Pd—Cu—In—B alloy according to claim 7, characterized by having a crystal grain size of 1.0 µm or less and a metallographic structure having uniformly distributed intermetallic compounds.

11. The quinary precipitation-hardening Ag—Pd—Cu—In—B alloy according to claim 10, characterized by being applied to electric and electronic equipment.

12. The quinary precipitation-hardening Ag—Pd—Cu—In—B alloy according to claim 10, characterized by being applied to contact probe pins.

* * * * *